(12) United States Patent
Lin et al.

(10) Patent No.: US 9,893,037 B1
(45) Date of Patent: Feb. 13, 2018

(54) MULTI-CHIP SEMICONDUCTOR PACKAGE, VERTICALLY-STACKED DEVICES AND MANUFACTURING THEREOF

(71) Applicant: NANYA TECHNOLOGY CORPORATION, New Taipei (TW)

(72) Inventors: Po-Chun Lin, Changhua County (TW); Chin-Lung Chu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/493,096

(22) Filed: Apr. 20, 2017

(51) Int. Cl.
*H01L 23/48* (2006.01)
*H01L 21/768* (2006.01)
*H01L 25/065* (2006.01)
*H01L 23/00* (2006.01)
*H01L 25/00* (2006.01)

(52) U.S. Cl.
CPC ........ *H01L 25/0657* (2013.01); *H01L 23/481* (2013.01); *H01L 24/06* (2013.01); *H01L 24/17* (2013.01); *H01L 25/50* (2013.01); *H01L 2224/0401* (2013.01); *H01L 2224/05017* (2013.01); *H01L 2224/13017* (2013.01); *H01L 2224/13022* (2013.01); *H01L 2224/16012* (2013.01); *H01L 2224/16146* (2013.01); *H01L 2224/16227* (2013.01); *H01L 2225/06513* (2013.01); *H01L 2225/06517* (2013.01); *H01L 2225/06527* (2013.01); *H01L 2225/06541* (2013.01); *H01L 2225/06555* (2013.01); *H01L 2225/06586* (2013.01); *H01L 2225/06593* (2013.01)

(58) Field of Classification Search
CPC ................. H01L 27/14636; H01L 21/76898
See application file for complete search history.

(56) References Cited

U.S. PATENT DOCUMENTS

| | | | | |
|---|---|---|---|---|
| 5,995,379 A * | 11/1999 | Kyougoku | ........ | H01L 23/49816 257/686 |
| 6,222,278 B1 * | 4/2001 | Miyamoto | .............. | H01L 23/50 257/686 |
| 6,448,661 B1 * | 9/2002 | Kim | ....... | H01L 23/481 257/686 |
| 9,831,155 B2 * | 11/2017 | Lin | ....... | H01L 23/481 |
| 2017/0263536 A1 * | 9/2017 | Lin | ....... | H01L 23/481 |

* cited by examiner

*Primary Examiner* — Thao P Le
(74) *Attorney, Agent, or Firm* — CKC & PARTNERS CO., LTD.

(57) ABSTRACT

A semiconductor chip includes a semiconductor device with an upper surface and a lower surface opposite to the upper surface. The semiconductor device includes an input terminal, a plurality of through silicon vias, a plurality of selection pads, a plurality of tilt pads and a plurality of tilt conductive structures. The through silicon vias are extended through the semiconductor device. The selection pads are located on the lower surface The tilt pads are located on the upper surface and connected to the selection pads through the through silicon vias respectively. Each tilt pad includes a pad surface that is non-parallel to the upper surface. A lower end of each tilt conductive structure is in contact with the pad surface of each tilt pad, and an upper end of each tilt conductive structure is vertically overlapped with an immediately-adjacent one of the tilt pads.

20 Claims, 4 Drawing Sheets

MULTI-CHIP SEMICONDUCTOR PACKAGE, VERTICALLY-STACKED DEVICES AND MANUFACTURING THEREOF

BACKGROUND

Field of Invention

The present invention relates to semiconductor packaging technology and, more particularly, to a multi-chip package with chip selection pads and a manufacturing method thereof.

Description of Related Art

To satisfy the pressing demands for increased integration and multi-functionality, various multi-chip packages have recently been developed.

A conventional multi-chip package is manufactured as described below. After manufacturing a wafer and dividing the wafer into a plurality of individual chips, the chip is attached and electrically connected to the substrate, and is encapsulated with a molding resin to form a package. Then, a multi-chip package is obtained by stacking the packages.

The conventional multi-chip packages are formed by stacking a plurality of packages using complex processes. Moreover, these multi-chip packages have much bigger sizes than the standard chip, thereby reducing the mounting density on the external apparatus. Further, since the multi-chip packages employ substrates, they cause long signal transmission routes and thereby signal delay results.

In order to improve memory capacity by stacking the same types of memory chips, there must be a chip selection mechanism to operate the desired memory chip. Therefore, each memory chip comprises a chip selection terminal. For example, in case of a DRAM chip, the Row Address Strobe (RAS), Column Address Strobe (CAS) or Chip Selection Pin (CSP) is used as the chip selection terminal. By selectively transmitting electronic signals to the specific chip selection terminal corresponding to the desired chip of the multi-chip package, the desired chip is selected for operation. Other non-selecting terminals of the memory chips in the multi-chip package are commonly connected together, but the chip selection terminal for each individual chip are isolated and connected to an external electronic component.

The conventional technique for separating the chip selection terminals of each chip from one another is disclosed in the above-described multi-chip package. That is, the chip selection terminal of each chip is connected to an external electronic component through connection wirings formed on a substrate of the package. Therefore, in order to separate the chip selection terminal of each chip from one another, each substrate should include a connection wiring configuration different from the other substrates, thereby increasing the production cost and reducing productivity.

SUMMARY

The present disclosure provides a semiconductor chip which includes a semiconductor device with an upper surface and a lower surface opposite to the upper surface. The semiconductor device includes an input terminal, a plurality of through silicon vias (TSVs), a plurality of selection pads, a plurality of tilt pads and a plurality of tilt conductive structures. The through silicon vias are extended through the semiconductor device, wherein one of the through silicon vias is connected to the input terminal. The selection pads are disposed on the lower surface, wherein one of the selection pads is connected to the input terminal, and rest of the selection pads are connected to the rest of the through silicon vias respectively. The tilt pads are disposed on the upper surface and connected to the selection pads through the through silicon vias respectively, wherein each tilt pad comprises a pad surface that is non-parallel to the upper surface. The tilt conductive structures are disposed on the corresponding tilt pads respectively, wherein a lower end of each tilt conductive structure is in contact with the pad surface of each tilt pad, and an upper end of each tilt conductive structure is vertically overlapped with an immediately-adjacent one of the tilt pads.

The present disclosure provides a multi-chip semiconductor package formed by vertically stacking a number (N) of semiconductor chips. Each semiconductor chip includes a semiconductor device with an upper surface and a lower surface opposite to the upper surface. The semiconductor device includes an input terminal, a number (M) of through silicon vias (TSVs), a plurality of selection pads, a number (M−1) of tilt pads and a plurality of tilt conductive structures. The through silicon vias are extended through the semiconductor device, wherein one of the through silicon vias is connected to the input terminal. The selection pads are disposed on the lower surface, wherein one of the selection pads is connected to the input terminal, and rest of the selection pads are connected to the rest of the through silicon vias respectively. The tilt pads are disposed on the upper surface and connected to the selection pads through the through silicon vias respectively, wherein each tilt pad comprises a pad surface that is non-parallel to the upper surface. The tilt conductive structures are disposed on the corresponding tilt pads respectively, wherein a lower end of each tilt conductive structure is in contact with the pad surface of each tilt pad, and an upper end of each tilt conductive structure is vertically overlapped with an immediately-adjacent one of the tilt pads.

The present disclosure provides a method for vertically stacking the semiconductor chips to form a multi-chip semiconductor package. The semiconductor chips are vertically stacked with respective lateral borders substantially aligned, and the upper end of each tilt conductive structure extending from one of the tilt pads on a lower one of the semiconductor chips is in contact with a corresponding one of the selection pads of an upper-adjacent one of the semiconductor chips, wherein the corresponding one of the selection pads of the upper-adjacent one of the semiconductor chips is vertically overlapped with an immediately-adjacent one of the tilt pads on the lower one of the semiconductor chips.

In one or more embodiments, each tilt conductive structure includes a pillar portion and a bump portion. The pillar portion extends from the pad surface of each tilt pad. The bump portion is disposed on an end of the pillar portion and distal from the pad surface of each tilt pad, wherein the bump portion is vertically overlapped with an immediately-adjacent one of the tilt pads.

In one or more embodiments, the pillar portion of each tilt conductive structure is extended substantially parallel to the pillar portion extending from an immediately-adjacent one of the tilt pads.

In one or more embodiments, the upper surface has a plurality of v-shaped grooves, and the tilt pads are conformally formed on the grooves respectively.

In one or more embodiments, an included angle between two surfaces of each v-shaped groove is about 90 degrees.

In one or more embodiments, the semiconductor device further comprises a passivation layer through which a plurality of conductive routes extend, wherein the tilt pads are connected to the through silicon vias through the conductive routes respectively.

In one or more embodiments, the tilt pads are spaced from one another, and the upper end of each tilt conductive structure extends beyond the tilt pad vertically that is contacted by the lower end of the same tilt conductive structure.

In one or more embodiments, the tilt pads are spaced from one another, and the bump portion of each tilt conductive structure extends beyond the tilt pad vertically that is contacted by the pillar portion of the same tilt conductive structure.

In sum, the semiconductor devices with tilt (electrically) conductive structures disclosed herein can be vertically stacked to form a multi-chip semiconductor package with a chip-selection function by a cost-saving and productive way.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
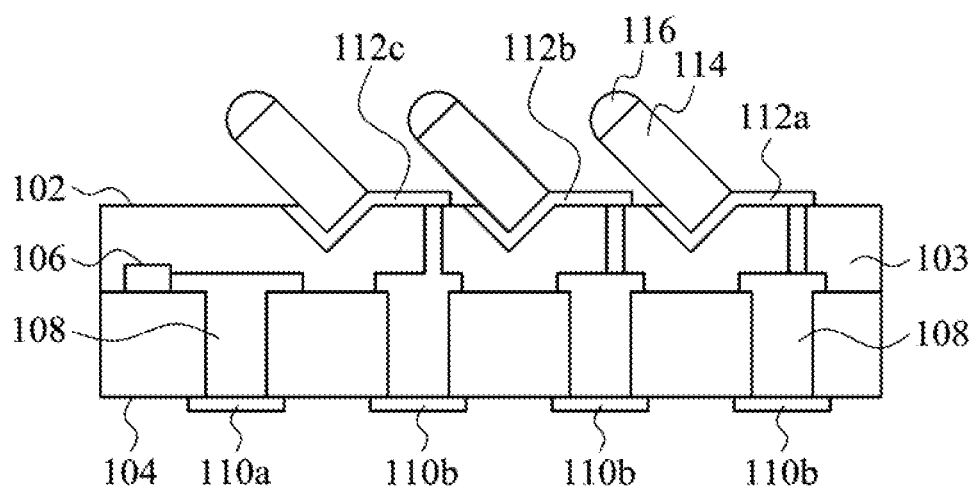
FIG. 1 illustrates a cross-sectional view of a semiconductor device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
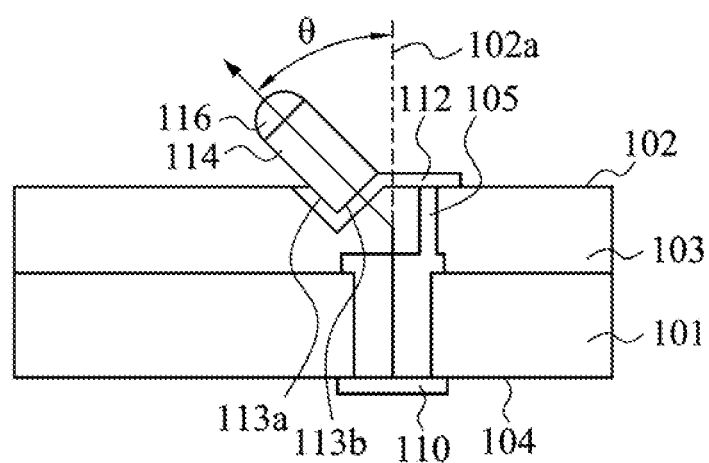
FIG. 2 illustrates a cross-sectional view of illustrates a detailed view of part of the semiconductor device in FIG. 1.

Reference is made to FIGS. 1-2. FIG. 1 illustrates a cross-sectional view of a semiconductor device according to one embodiment of the present disclosure, and FIG. 2 illustrates a cross-sectional view of illustrates a detailed view of part of the semiconductor device in FIG. 1. A semiconductor chip includes a semiconductor device 100 with an upper surface 102 and a lower surface 104 opposite to the upper surface 102. The semiconductor device 100 includes an input terminal 106, a plurality of through silicon vias (TSVs) 108, a plurality of selection pads (110a, 110b), a plurality of tilt pads (112a, 112b, 112c) and a plurality of tilt conductive structures.

In an embodiment of the present disclosure, each tilt conductive structure includes a pillar portion 114 and a bump portion 116. The pillar portion 114 extends from the pad surface (113a or 113b) of each tilt pad 112, and the pad surface (113a or 113b) is non-parallel to the upper surface 102. That is, a lower end of each tilt conductive structure (i.e., pillar portion 114) is in contact with the pad surface (113a or 113b) of each tilt pad 112. The bump portion 116 is located on an end of the pillar portion 114 and distal from the pad surface (113a or 113b) of each tilt pad 112.

In an embodiment of the present disclosure, the tilt pads (112a, 112b, 112c) are spaced from one another and thus electrically insulated or isolated from one another. As shown in FIG. 2, the upper end of each tilt conductive structure vertically extends beyond the tilt pad 112 that is contacted by the lower end of the same tilt conductive structure. That is, the bump portion 116 of each tilt conductive structure vertically extends beyond the tilt pad 112 that is contacted by the pillar portion 114 of the same tilt conductive structure.

When each tilt conductive structure is "tilt", it means that a lengthwise direction of the tilt conductive structure is biased from a normal direction 102a of the upper surface 102 of the semiconductor device 100 by an included angle θ (e.g., greater than 0 degree).

In an embodiment of the present disclosure (as shown in FIG. 1), the upper end (e.g., the bump portion 116) of each tilt conductive structure vertically extends beyond the tilt pad (e.g., 112a) that is contacted by the lower end of the same tilt conductive structure (e.g., the pillar portion 114), and the upper end (e.g., the bump portion 116) of each tilt conductive structure is vertically overlapped with an immediately-adjacent one of the tilt pads (e.g., 112b), but the upper end (e.g., the bump portion 116) of each tilt conductive structure is still spaced from the immediately-adjacent one of the tilt pads (e.g., 112b).

The through silicon vias 108 are extended through the semiconductor device 100, and one of the through silicon vias 108 is connected to the input terminal 106. The selection pads (110a, 110b) are located on the lower surface 104, wherein one of the selection pads 110a is connected to the input terminal 106, and rest of the selection pads 110b are connected to the rest of the through silicon vias 108 respectively. In this embodiment, the selection pad 110a connected to the input terminal 106 is the outermost one of the selection pads and rest of the selection pads 110b are connected to the rest of the through silicon vias 108 respectively. The tilt pads (112a, 112b, 112c) are located on the upper surface 102 and connected to the selection pads 110b through the through silicon vias 108 respectively. Each tilt pad 112 includes a pad surface (113a or 113b) that is non-parallel to the upper surface 102. The tilt conductive structures (114&116) are located on the corresponding tilt pads (112a, 112b, 112c) respectively. A lower end of each tilt conductive structure is in contact with the pad surface (113a or 113b) of each tilt pad 112, and an upper end (e.g., the bump portion 116) of each tilt conductive structure is vertically overlapped with an immediately-adjacent one of the tilt pads.

Figure 3:
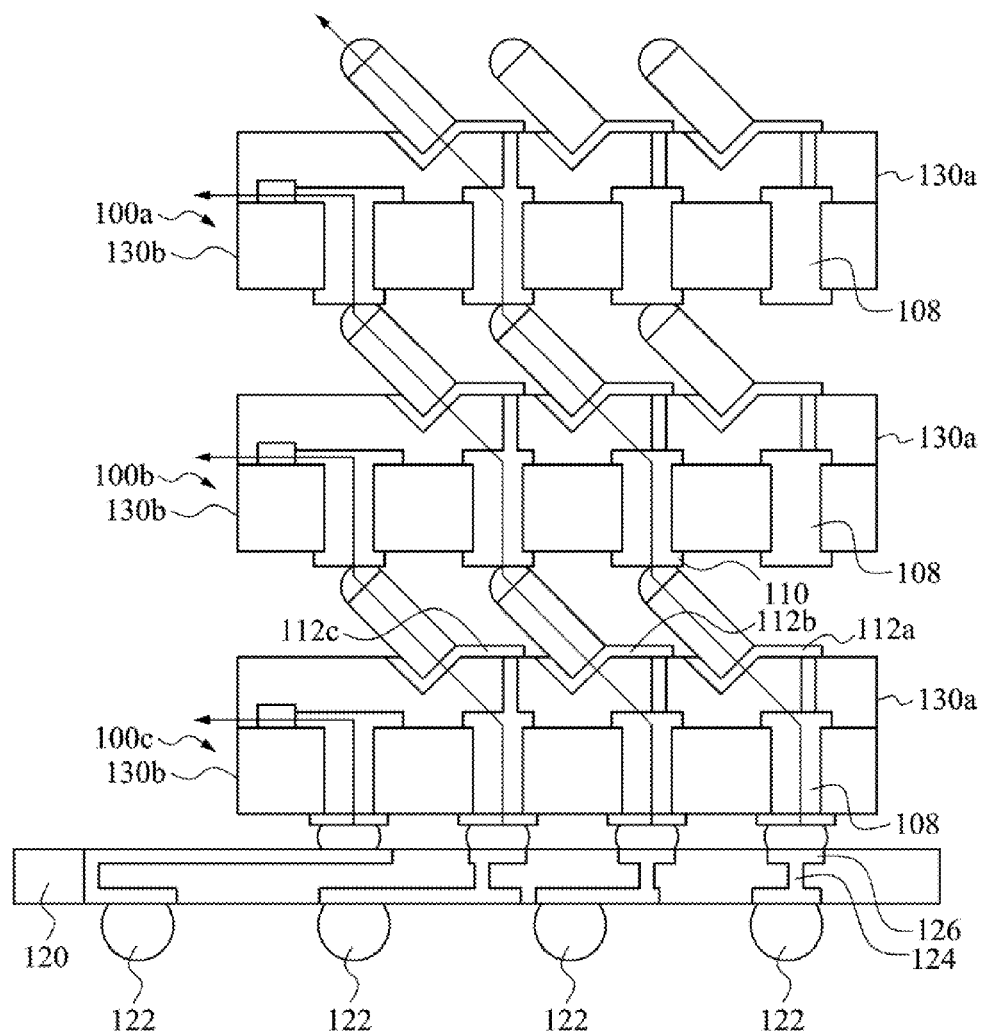
FIG. 3 illustrates a cross-sectional view of a multi-chip semiconductor package according to one embodiment of the present disclosure.

Reference is made to FIG. 3. FIG. 3 illustrates a cross-sectional view of a multi-chip semiconductor package 200 according to one embodiment of the present disclosure. The multi-chip semiconductor package 200 is formed by vertically stacking a number (N) of the same semiconductor devices (100a, 100b, 100c). The number (N) should be equal to or less than a number (M) of the through silicon vias 108 extended through the semiconductor device. For example, there are four through silicon vias 108 within each semiconductor devices (100a, 100b, 100c), the maximum number of semiconductor chips is four, but three or two semiconductor chips are also applicable. In this embodiment, three semiconductor devices (100a, 100b, 100c) are vertically stacked with respective lateral borders (130a, 130b)

substantially aligned, and each semiconductor device has four through silicon vias. One more semiconductor device may be attached upon.

In each semiconductor device (100a, 100b, 100c) that is vertically stacked within the multi-chip semiconductor package 200, a number (M−1) of tilt pads (112a, 112b, 112c) located on respective upper surface and connected to the selection pads 110 (located on respective lower surface) through the through silicon vias 108 respectively. Therefore, The chip-selection functions can be provided by sending signals via the routes indicated by arrows as illustrated in FIG. 3. The more tilt pads and tilt conductive structures designed on each chip, the more chips can be vertically stacked to form a multi-chip semiconductor package with a chip-selection function.

When three semiconductor devices (100a, 100b, 100c) are vertically stacked, the upper end of each tilt conductive structure extending from each tilt pad (e.g., 112a) on a lower one (e.g., 100c) of the semiconductor chips is in contact with a corresponding one of the selection pads of an upper-adjacent one (e.g., 100b) of the semiconductor chips, wherein the corresponding selection pad (e.g., 110) of the upper-adjacent semiconductor chip (e.g., 100b) is vertically overlapped with an immediately-adjacent tilt pad (e.g., 112b) on the lower semiconductor chip (e.g., 100c).

In this embodiment, the pillar portion 114 extending from each tilt pad is extended substantially parallel to the pillar portion 114 extending from an immediately-adjacent one of the tilt pads. For example, the pillar portion 114 extending from the tilt pad 112a is extended substantially parallel to the pillar portion 114 extending from an immediately-adjacent tilt pad 112b. In other embodiments, the pillar portions 114 may not be extended substantially parallel to each other as long as the pillar portions 114 or the bump portions 116 can be electrically insulated or isolated from each other.

As shown in FIG. 3, an external-connection substrate 120 may be used to vertically stack a number (N) of the same semiconductor devices (100a, 100b, 100c). That is, the lowermost semiconductor device 100c is attached on the external-connection substrate 120 with its selection pads 110 soldered on the corresponding pads 126 of the external-connection substrate 120. The external-connection substrate 120 may still has redistribution layers 124 within and lower solder bumps 122 to mount on another application device.

After the three semiconductor devices (100a, 100b, 100c) are vertically stacked on the external-connection substrate 120, an epoxy molding resin (not shown in the drawings) may be used to enclose the three semiconductor devices (100a, 100b, 100c) and filled into the gaps between any adjacent two devices (e.g., gaps among the tilt conductive structures) so as to form the multi-chip semiconductor package 200.

Reference is made to FIGS. 4-9. FIGS. 4-9 are serial cross-sectional views illustrating a method for manufacturing a semiconductor device according to one embodiment of the present disclosure.

Figure 4:
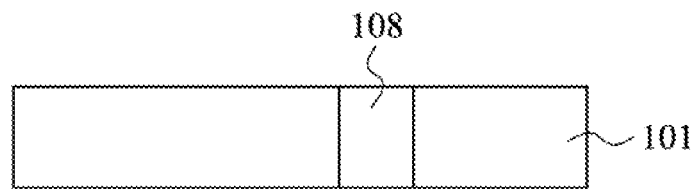
FIGS. 4-9 are serial cross-sectional views illustrating a method for manufacturing a semiconductor device according to one embodiment of the present disclosure.

As illustrated in FIG. 4, a semiconductor substrate 101 is provided and a through silicon via 108 is formed to extend through. The through silicon via 108 may be made of cooper or its alloys.

Figure 5:
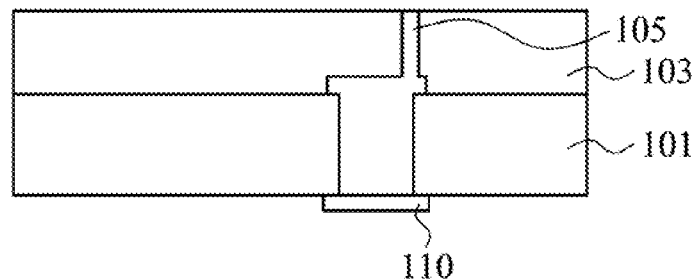

As illustrated in FIG. 5, a passivation layer 103 is formed over the semiconductor substrate 101 and a selection pad 110 is formed on the lower surface of the semiconductor substrate 101. A conductive route 105 is subsequently formed to extend through the passivation layer 103.

Figure 6:
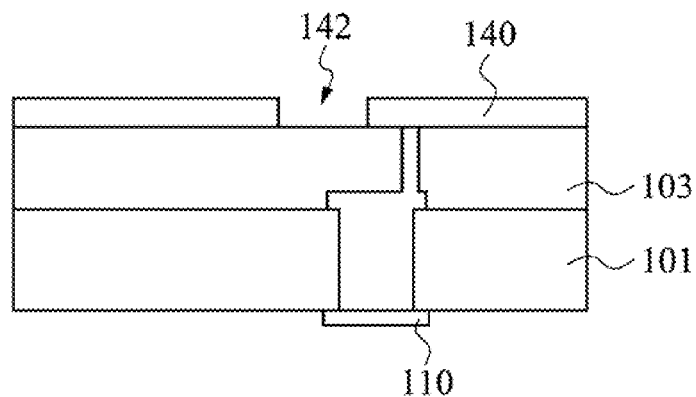

As illustrated in FIG. 6, a hard mask 140 is formed over the passivation layer 103 and patterned to form an opening 142 to expose a desired etching area.

Figure 7:
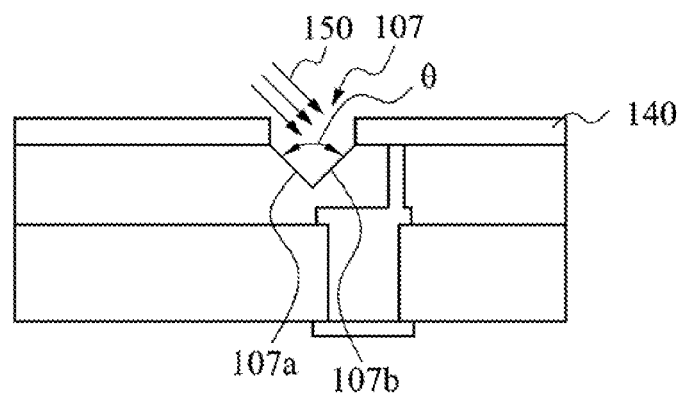

As illustrated in FIG. 7, a laser beam 150 or other etching way is used to etch a v-shaped groove 107 (through the opening 142) on an upper surface of the semiconductor device. In this embodiment, an included angle θ between two surfaces (107a, 107b) of each v-shaped groove 107 is about 90 degrees.

Figure 8:
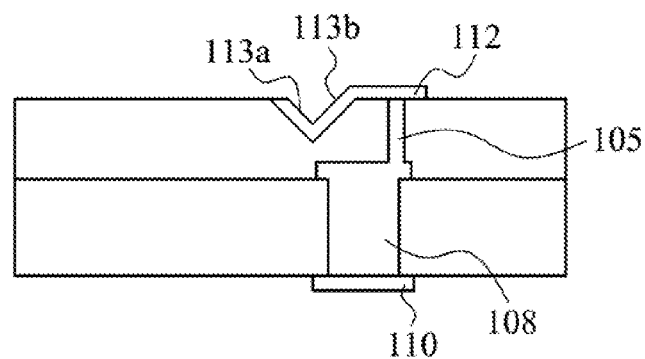

As illustrated in FIG. 8, the hard mask 140 is removed and a tilt pad 112 is conformally formed on the groove 107 to form the pad surfaces (113a or 113b) that is non-parallel to the upper surface of the semiconductor device. A portion of the tilt pad 112 extending out of the groove 107 is electrically connected to the corresponding selection pad 110 through the conductive route 105 as well as the through silicon via 108.

Figure 9:
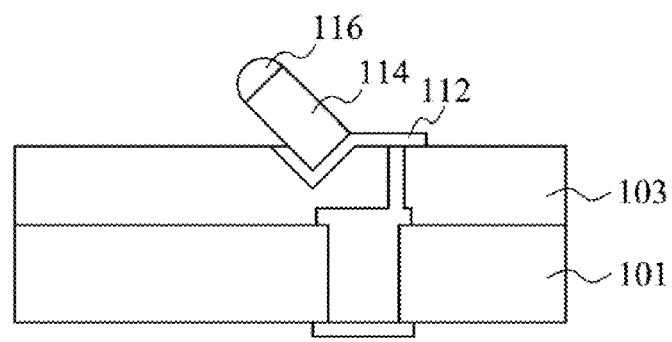

As illustrated in FIG. 9, a pillar portion 114 is formed to extend from the pad surface (113a or 113b) of the tilt pad 112 and a bump portion 116 is formed on an upper end of the pillar portion 114 and distal from the pad surface (113a or 113b) of the tilt pad 112. The pillar portion 114 is made of cooper or its alloys, and the bump portion 116 is made of solder metal materials, e.g., eutectic tin and/or lead.

Therefore, a semiconductor device with single tilt (electrically) conductive structure is formed. A semiconductor device with multiple tilt (electrically) conductive structures can be manufactured with similar ways and used as one chip or die of the vertically-stacked package, e.g., a plurality of integrated circuit chips or dies are manufactured on the same wafer and divided into separated ones, and a number of integrated circuit dies with above-mentioned tilt (electrically) conductive structures can be vertically stacked (e.g., by heating to) to form a multi-chip semiconductor package (e.g., the multi-chip semiconductor package 200 in FIG. 3). The chip-selection function can be achieved by communicating via the selection pads and the tilt (electrically) conductive structure. Etc.

In sum, the semiconductor devices with tilt (electrically) conductive structures disclosed herein can be vertically stacked to form a multi-chip semiconductor package with a chip-selection function by a cost-saving and productive way.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A semiconductor chip comprising:
  a semiconductor device having an upper surface and a lower surface opposite to the upper surface, wherein the semiconductor device comprises:
    an input terminal;
    a plurality of through silicon vias (TSVs) extended through the semiconductor device, wherein one of the through silicon vias is connected to the input terminal; and
    a plurality of selection pads disposed on the lower surface, wherein one of the selection pads is con- nected to the input terminal, and rest of the selection pads are connected to the rest of the through silicon vias respectively;

a plurality of tilt pads disposed on the upper surface and connected to the selection pads through the through silicon vias respectively, wherein each tilt pad comprises a pad surface that is non-parallel to the upper surface; and a plurality of tilt conductive structures disposed on the corresponding tilt pads respectively, wherein a lower end of each tilt conductive structure is in contact with the pad surface of each tilt pad, and an upper end of each tilt conductive structure is vertically overlapped with an immediately-adjacent one of the tilt pads.

2. The semiconductor chip of claim 1, wherein each tilt conductive structure comprises:

a pillar portion extending from the pad surface of each tilt pad; and a bump portion disposed on an end of the pillar portion and distal from the pad surface of each tilt pad, wherein the bump portion is vertically overlapped with an immediately-adjacent one of the tilt pads.

3. The semiconductor chip of claim 2, wherein the pillar portion extending from each tilt pad is extended substantially parallel to the pillar portion extending from an immediately-adjacent one of the tilt pads.

4. The semiconductor chip of claim 1, wherein the upper surface has a plurality of v-shaped grooves, and the tilt pads are conformally formed on the v-shaped grooves respectively.

5. The semiconductor chip of claim 4, wherein an included angle between two surfaces of each v-shaped groove is about 90 degrees.

6. The semiconductor chip of claim 4, wherein the semiconductor device further comprises a passivation layer through which a plurality of conductive routes extend, wherein the tilt pads are connected to the through silicon vias through the conductive routes respectively.

7. The semiconductor chip of claim 1, wherein the tilt pads are spaced from one another, and the upper end of each tilt conductive structure extends vertically beyond one of the tilt pads that is contacted by the lower end of the same tilt conductive structure.

8. The semiconductor chip of claim 2, wherein the tilt pads are spaced from one another, and the bump portion of each tilt conductive structure extends vertically beyond one of the tilt pads that is contacted by the pillar portion of the same tilt conductive structure.

9. A multi-chip semiconductor package formed by vertically stacking a number (N) of semiconductor chips, each semiconductor chip comprising:

a semiconductor device having an upper surface and a lower surface opposite to the upper surface, wherein the semiconductor device comprises:
an input terminal;
a number (M) of through silicon vias (TSVs) extended through the semiconductor device, wherein M≥N, and one of the through silicon vias is connected to the input terminal; and
a plurality of selection pads disposed on the lower surface, wherein one of the selection pads is connected to the input terminal, and rest of the selection pads are connected to the rest of the through silicon vias respectively,
a number (M−1) of tilt pads disposed on the upper surface and connected to the selection pads through the through silicon vias respectively, wherein each tilt pad comprises a pad surface that is non-parallel to the upper surface; and
a plurality of tilt conductive structures disposed on the corresponding tilt pads respectively, wherein a lower end of each tilt conductive structure is in contact with the pad surface of each tilt pad, and an upper end of each tilt conductive structure is vertically overlapped with an immediately-adjacent one of the tilt pads.

10. The multi-chip semiconductor package of claim 9, wherein each tilt conductive structure comprises:

a pillar portion extending from the pad surface of each tilt pad; and a bump portion disposed on an end of the pillar portion and distal from the pad surface of each tilt pad, wherein the bump portion is vertically overlapped with an immediately-adjacent one of the tilt pads.

11. The multi-chip semiconductor package of claim 10, wherein the pillar portion of each tilt conductive structure is extended substantially parallel to the pillar portion extending from an immediately-adjacent one of the tilt pads.

12. The multi-chip semiconductor package of claim 9, wherein the upper surface has a plurality of v-shaped grooves, and the tilt pads are conformally formed on the grooves respectively.

13. The multi-chip semiconductor package of claim 12, wherein an included angle between two surfaces of each v-shaped groove is about 90 degrees.

14. The multi-chip semiconductor package of claim 12, wherein the semiconductor device further comprises a passivation layer through which a plurality of conductive routes extend, wherein the tilt pads are connected to the through silicon vias through the conductive routes respectively.

15. The multi-chip semiconductor package of claim 9, wherein the number (N) of semiconductor chips are vertically stacked with respective lateral borders substantially aligned.

16. The multi-chip semiconductor package of claim 9, wherein the one of the selection pads connected to the input terminal is the outermost one of the selection pads.

17. The multi-chip semiconductor package of claim 9, further comprising an external-connection substrate, wherein the external-connection substrate comprises:

a plurality of electrical bumps electrically connected to the selection pads of a lowermost one of the number (N) of semiconductor chips.

18. The multi-chip semiconductor package of claim 9, wherein the tilt pads are spaced from one another, and the upper end of each tilt conductive structure extends beyond the tilt pad vertically that is contacted by the lower end of the same tilt conductive structure.

19. The multi-chip semiconductor package of claim 10, wherein the tilt pads are spaced from one another, and the bump portion of each tilt conductive structure extends beyond the tilt pad vertically that is contacted by the pillar portion of the same tilt conductive structure.

20. A method for vertically stacking a number of the semiconductor chips of claim 1 to form a multi-chip semiconductor package comprising:

vertically stacking the semiconductor chips with respective lateral borders substantially aligned, and the upper end of each tilt conductive structure extending from one of the tilt pads on a lower one of the semiconductor chips is in contact with a corresponding one of the selection pads of an upper-adjacent one of the semiconductor chips, wherein the corresponding one of the selection pads of the upper-adjacent one of the semiconductor chips is vertically overlapped with an immediately-adjacent one of the tilt pads on the lower one of the semiconductor chips.

* * * * *